United States Patent
Kim et al.

(10) Patent No.: US 7,634,702 B2
(45) Date of Patent: Dec. 15, 2009

(54) INTEGRATED CIRCUIT APPARATUS HAVING IMPROVED TEST CIRCUIT AND METHOD OF TESTING THE INTEGRATED CIRCUIT APPARATUS

(75) Inventors: Hong-beom Kim, Suwon-si (KR); Yoon-gyu Song, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 485 days.

(21) Appl. No.: 11/182,532

(22) Filed: Jul. 15, 2005

(65) Prior Publication Data

US 2006/0013046 A1    Jan. 19, 2006

(30) Foreign Application Priority Data

Jul. 16, 2004    (KR) .................... 10-2004-0055464

(51) Int. Cl.
   *G01R 31/28*    (2006.01)
(52) U.S. Cl. ...................... 714/735; 714/734
(58) Field of Classification Search ................. 714/718, 714/719, 732–736
   See application file for complete search history.

(56) References Cited

U.S. PATENT DOCUMENTS

| | | | | |
|---|---|---|---|---|
| 5,481,549 A | * | 1/1996 | Tokuyama | .................. 714/744 |
| 5,951,704 A |   | 9/1999 | Sauer et al. | .................. 714/736 |
| 6,421,789 B1 | * | 7/2002 | Ooishi | ............................ 714/7 |
| 6,611,469 B2 | * | 8/2003 | Williams et al. | ............ 365/221 |
| 6,671,839 B1 | * | 12/2003 | Cote et al. | .................. 714/726 |
| 6,725,406 B2 | * | 4/2004 | Kakizawa et al. | ............ 714/727 |
| 6,763,079 B1 | * | 7/2004 | Iwamoto | ...................... 375/376 |
| 6,880,117 B2 | * | 4/2005 | Tseng et al. | ................. 714/718 |
| 6,892,270 B2 | * | 5/2005 | Roohparvar | ................ 711/105 |
| 7,464,309 B2 | * | 12/2008 | Seo | ............................. 714/719 |
| 2003/0120989 A1 |   | 6/2003 | Zumkehr | ..................... 714/738 |

FOREIGN PATENT DOCUMENTS

| | | | |
|---|---|---|---|
| JP | 2004146046 A | * | 5/2004 |
| JP | 2007310989 A | * | 11/2007 |
| KR | 2001-0027864 |   | 4/2001 |
| KR | 2002-0056801 |   | 7/2002 |
| KR | 2004092260 A | * | 3/2004 |

OTHER PUBLICATIONS

"Gate level fault diagnosis in scan-based BIST" by Bayraktaroglu et al. This paper appears in: Design, Automation and Test in Europe Conference and Exhibition, 2002. Proceedings Publication Date: 2002 On pp. 376-381 ISBN: 0-7695-1471-5 INSPEC Accession No. 7341984.*

(Continued)

*Primary Examiner*—Cynthia Britt
(74) *Attorney, Agent, or Firm*—Mills & Onello, LLP

(57) ABSTRACT

An integrated circuit apparatus including an improved test circuit and a method of testing the integrated circuit apparatus are provided. The integrated circuit apparatus determines pass or fail of the integrated circuit apparatus itself by comparing internal DQ data output by a core logic circuit with test patterns set by a mode register set (MRS) code or test patterns directly input from an external source.

16 Claims, 9 Drawing Sheets

OTHER PUBLICATIONS

"Semiconductor manufacturing process monitoring using built-in self-test for embedded memories" Schanstra et al. This paper appears in: Test Conference, 1998. Proceedings., International Publication Date: Oct. 18-23, 1998 On pp. 872-881 ISSN: 1089-3539 ISBN: 0-7803-5093-6 INSPEC Accession No. 6265617.*

"A diagnostic test generation procedure based on test elimination by vector omission for synchronous sequential circuits" by Pomeranz et al. IEEE Transactions on Computer-Aided Design of Integrated Circuits and Systems, Publication Date: May 2000 vol. 19, Issue: 5 On pp. 589-600 ISSN: 0278-0070 INSPEC Accession No. 6616665.*

* cited by examiner

INTEGRATED CIRCUIT APPARATUS HAVING IMPROVED TEST CIRCUIT AND METHOD OF TESTING THE INTEGRATED CIRCUIT APPARATUS

BACKGROUND OF THE INVENTION

This application claims the benefit of Korean Patent Application No. 10-2004-0055464, filed on Jul. 16, 2004, in the Korean Intellectual Property Office, the contents of which are incorporated herein in their entirety by reference.

1. Field of the Invention

The present invention relates to testing of an integrated circuit apparatus, and more particularly, to an integrated circuit apparatus capable of testing itself using test patterns based on a mode register set (MRS) code or external test patterns and a method of testing the integrated circuit apparatus.

2. Description of the Related Art

A test of an integrated circuit memory, such as double data rate (DDR) synchronous dynamic random access memory (SDRAM) or the like, is made to separate defective samples from normal samples before the integrated circuit memory is circulated in the market. As shown in FIG. 1, a conventional integrated circuit apparatus 100 is tested by testing whether a core logic circuit 110, which is inside an integrated circuit chip, operates normally. The core logic circuit 110 may be a circuit including a memory cell array and its peripheral circuits in an integrated circuit memory device, such as a DDR SDRAM. Alternatively, the core logic circuit 110 may be a logic circuit for performing a major function included in an integrated circuit apparatus other than a memory device. To test the core logic circuit 110, control signals used to output DQ data are applied to the core logic circuit 110, and a determination is made as to whether the DQ data output by the core logic circuit 110 according to the control signals has passed or failed to determine whether the logic circuit 110 operates normally.

Typically, pass or failure of a product depends on a decision made by a tester 170. That is, the tester 170 generates control signals, such as a command, an address, a test data pattern, and the like, in a sequence programmed by an engineer, and applies the control signals to the product to operate the product. For example, to test an integrated circuit apparatus, test data is written to a corresponding address, and test data stored in the address is read out, thereby outputting DQ data. Thereafter, the tester 170 determines pass or failure of the integrated circuit apparatus by comparing the DQ data output from the integrated circuit apparatus with a test data pattern expected as output data. The tester 170 memorizes the address that stores the unexpected data. Through these testing operations, the engineer can discern a defective product, i.e., a defective integrated circuit apparatus. The defective integrated circuit apparatus can be appropriately repaired using the failed address. A well-known example of such a testing technique is a parallel bit test (PBT) technique.

When a product is tested using a general testing technique, such as the PBT technique, the DQ data output by the core logic circuit 110 is input to the tester 170 via an output buffer 120, a bonding pad 130, a lead frame 140, a chip socket 150, and a printed circuit board (PCB) wire 160. Noise due to such a long path between the logic circuit 110 and the tester 170 causes jitter to occur in the DQ data. Accordingly, a real valid data window is smaller than a theoretical valid data window as shown in FIG. 2A. If a clock cycle time tCC of a product is 2 nsec, the theoretical valid data window is 1 nsec, but the real valid data window is about 0.6 nsec because of jitter and in consideration of a worst-case situation. This example is based on a single product. However, upon mass production, the real valid data window is reduced from about 0.6 nsec to about 0.4 nsec or less as shown in FIG. 2B, considering a run-to-run or wafer-to-wafer deviation.

This reduction of the real valid data window occurs more seriously in low-voltage, low-power, high-frequency products. Hence, the reliability of the DQ data input to the tester 170 is degraded, and serious overkill occurs while pass or failure of a product is being determined by a comparison of the degraded DQ data with the test pattern, which is ideal DQ data. Consequently, throughput of the product is degraded. To solve this throughput degradation, the tester 170 is reconstructed in hardware and corrects a test program so that a correlation can be established in consideration of jitter of the DQ data, thereby somewhat increasing the accuracy in determining pass or failure of a product. This external hardware or software correction of the tester 170 can be applied to a single product. However, it is difficult to make such a correction to the hardware or software of the tester 170 while considering the run-to-run or wafer-to-wafer deviation.

SUMMARY OF THE INVENTION

The present invention provides an integrated circuit apparatus that improves a determination of pass or failure of a product by including a test circuit that compares DQ data with test patterns either set by a mode register set (MRS) code or directly received from an external pin.

The present invention also provides a method of testing the integrated circuit apparatus which compares the DQ data with the test patterns either set by the MRS code or directly received from the external pin.

According to an aspect of the present invention, there is provided an automatic test circuit comprising a determination circuit and a storage unit. The determination circuit compares output data generated by a logic operation with test patterns expected as a result of the logic operation and generates a determination result signal. The storage circuit checks logic states of consecutive determination result signals. When any one of the determination result signals has a first logic state, the storage unit stores and outputs final pass/fail data in a first condition. When all of the determination result signals have the second logic state, the storage unit stores and outputs final pass/fail data in a second condition.

The determination circuit generates the determination result signal having the second logic state when all of the output data have the same logic states as logic states of the test patterns or when all of the logic states have logic states opposite to the logic states of the test patterns, and otherwise, generates the determination result signal in the first logic state.

The storage circuit generates the final pass/fail data having the first condition when any one of the signals obtained by sampling the determination result signal at a first logic state of a pulse signal has a first logic state or when any one of the signals obtained by sampling the determination result signals at a second logic state of the pulse signal has a first logic state.

In one embodiment, the storage circuit includes a first sampling logic and a second sampling logic. The first sampling logic samples a logic state of the determination result signal when the pulse signal is in the second logic state and latches sampled signals using a latch circuit. When any one of the sampled signals has the first logic state, the latch circuit latches a logic state. Otherwise, the latch circuit latches a logic state opposite to the logic state. The second sampling logic samples a logic state of the determination result signal when the pulse signal is in the first logic state and latches sampled signals using a latch circuit. When any one of the sampled signals has the first logic state, the latch circuit latches a logic state. Otherwise, the latch circuit latches a logic state opposite to the logic state.

According to another aspect of the present invention, there is provided an integrated circuit apparatus including: a logic circuit generating a DQS signal and DQ data; a register receiving and storing a mode register set (MRS) code and outputting test patterns which are expected outputs of the logic circuit, a first set signal, and a second set signal; and an automatic test circuit receiving the DQS signal and the DQ data via respective bonding pads, determining whether the received DQ data are the same as the test patterns, and outputting final pass/fail data in accordance with the first and second set signals.

In one embodiment, the automatic test circuit comprises: a determination circuit comparing the DQ data with the test patterns to generate a determination result signal; and a storage circuit checking logic states of consecutive determination result signals and storing and outputting final pass/fail data in a first condition when any one of the consecutive determination result signals has a first logic state and storing and outputting final pass/fail data in a second condition when all of the consecutive determination result signals have the second logic state.

The determination circuit can receive the DQS signal and the DQ data in response to the first set signal.

The determination circuit can generate the determination result signal in the second logic state when all of the DQ data have the same logic states as logic states of the test patterns or when all of the logic states of the DQ data have logic states opposite to the logic states of the test patterns, and otherwise, can generate the determination result signal in the first logic state. In one embodiment, the storage circuit outputs the final pass/fail data in response to the second set signal.

In one embodiment, the storage circuit checks the logic state of the determination result signal at both first and second logic states of the DQS signal. The storage circuit can generate the final pass/fail data in the first condition when any one of the signals obtained by sampling the determination result signal at a first logic state of the DQS signal has a first logic state or when any one of the signals obtained by sampling the determination result signals at a second logic state of the DQS signal, has a first logic state.

In one embodiment, the storage circuit comprises: a first sampling logic sampling a logic state of the determination result signal when the DQS signal is in the second logic state and latching sampled signals using a latch circuit, wherein when any one of the sampled signals has the first logic state, the latch circuit latches a logic state, and otherwise, the latch circuit latches a logic state opposite to the logic state; a second sampling logic sampling a logic state of the determination result signal when the DQS signal is in the first logic state and latching sampled signals using a latch circuit, wherein when any one of the sampled signals has the first logic state, the latch circuit latches a logic state, and otherwise, the latch circuit latches a logic state opposite to the logic state; a NOR logic performing a NOR operation on the outputs of the first and second sampling logics and outputting a result of the NOR operation as pass/fail data; a latch circuit including two inverters connected to each other in such a way that an input and an output of one inverter are connected to an output and an input of the other inverter, respectively, the latch circuit receiving the pass/fail data via one of the two inverters, latching the pass/fail data, and outputting an inverted signal of the pass/fail data; a first inverter inverting an output of the latch circuit; a second inverter inverting the second set signal; and a passgate outputting an output of the first inverter as the final pass/fail data in response to the second set signal and the output of the second inverter.

According to another aspect of the present invention, there is provided a method of testing an integrated circuit apparatus, the method including: generating a DQS signal and DQ data using a logic circuit which performs a logic operation; receiving and storing a mode register set (MRS) code and outputting test patterns, which are expected outputs of the logic circuit, and first and second set signals; and receiving the DQS signal and the DQ data via respective bonding pads, determining whether the received DQ data are the same as the test patterns, and outputting final pass/fail data in accordance with the first and second set signals.

In one embodiment, generating the final pass/fail data comprises: comparing the DQ data with the test patterns to generate a determination result signal; and checking logic states of consecutive determination result signals and storing and outputting final pass/fail data having a first logic state when any one of the consecutive determination result signals has a first logic state and storing and outputting final pass/fail data having a second logic state when all of the consecutive determination result signals have the second logic state.

In one embodiment, the DQS signal and the DQ data are received in response to the first set signal and used to generate the final pass/fail data.

In one embodiment, the determination result signal in the second logic state is generated when all of the DQ data have the same logic states as logic states of the test patterns or when all of the logic states of the DQ data have logic states opposite to the logic states of the test patterns, and otherwise, the determination result signal in the first logic state is generated.

In one embodiment, the final pass/fail data is output to a DQ pad in response to the second set signal.

In one embodiment, the logic state of the determination result signal is checked at both first and second logic states of the DQS signal. In one embodiment, the final pass/fail data in the first condition is generated when any one of the signals obtained by sampling the determination result signal at a first logic state of the DQS signal has a first logic state or when any one of the signals obtained by sampling the determination result signals at a second logic state of the DQS signal has a first logic state.

In one embodiment, storing and outputting of the final pass/fail data comprises: sampling a logic state of the determination result signal when the DQS signal is in the second logic state and latching sampled signals using a latch circuit, wherein when any one of the sampled signals has the first logic state, the latch circuit latches a logic state, and otherwise, the latch circuit latches a logic state opposite to the logic state; sampling a logic state of the determination result signal when the DQS signal is in the first logic state and latching sampled signals using a latch circuit, wherein when any one of the sampled signals has the first logic state, the latch circuit latches a logic state, and otherwise, the latch circuit latches a logic state opposite to the logic state; performing a NOR operation on the outputs of the first and second sampling logics and outputting a result of the NOR operation as pass/fail data; receiving the pass/fail data via one of two inverters connected to each other in such a way that an input and an output of one inverter are connected to an output and an input of the other inverter, respectively, latching the pass/fail data, and outputting an inverted signal of the pass/fail data; inverting the output of the latch circuit; inverting the second set signal; and outputting the inverted output of the latch circuit as the final pass/fail data in response to the second set signal and the inverted second set signal.

According to another aspect of the present invention, there is provided a test circuit including an internal data comparison logic, an external data comparison logic, a result comparison logic, and OR logics. The internal data comparison logic compares logic states of each two of output data generated by an internal logic operation. When the logic states of the two output data are identical, the internal data comparison logic outputs signals having a first logic state as a result of the comparison. Otherwise, the internal data comparison logic outputs signals having a second logic state as the result of the comparison. The external data comparison logic receives test patterns, which are expected output, from an external source and compares logic states of each two of the test patterns. When the logic states of the two test patterns are identical, the external data comparison logic outputs signals in a first logic state as a result of the comparison. Otherwise, the external data comparison logic outputs signals in a second logic state as the result of the comparison. The result comparison logic compares a logic state of each of the signals output by the internal data comparison logic with a logic state of each of the signals output by the external data comparison logic. When the logic states of the output data are identical, the result comparison logic outputs signals having a first logic state as a result of the comparison. Otherwise, the result comparison logic outputs signals having a second logic state as the result of the comparison. The OR logics perform an OR operation on each two of the signals output by the result comparison logic. If the OR operation results in two or more signals, the OR logics re-perform the OR operation on each two of the resultant signals and perform a subsequent OR operation until a single resultant signal is obtained. 22. The test circuit of claim 21, wherein an equal number of test patterns to the number of output data are received via an external pin of an integrated circuit apparatus.

According to another aspect, the invention is directed to a method of testing an integrated circuit apparatus, the method comprising: performing a first comparison of logic states of each two of output data generated by an internal logic operation and outputting signals having a first logic state as a result of the first comparison when the logic states of the two output data are identical and otherwise, outputting signals having a second logic state as the result of the first comparison; receiving test patterns, which are expected output, from an external source, performing a second comparison of logic states of each two of the test patterns and outputting signals having a first logic state as a result of the second comparison when the logic states of the two test patterns are identical and otherwise, outputting signals having a second logic state as the result of the second comparison; performing a third comparison of a logic state of each of the signals corresponding to the result of the first comparison with a logic state of each of the signals corresponding to the result of the second comparison and outputting signals in a first logic state as a result of the third comparison when the logic states of the each output data are identical and otherwise, outputting signals in a second logic state as the result of the third comparison; and performing an OR operation on each two of the signals corresponding to the result of the third comparison and, if the OR operation results in two or more signals, re-performing the OR operation on each two of the resultant signals and performing a subsequent OR operation until a single resultant signal is obtained.

In one embodiment, an equal number of test patterns to the number of output data are received via an external pin of an integrated circuit apparatus.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 3:
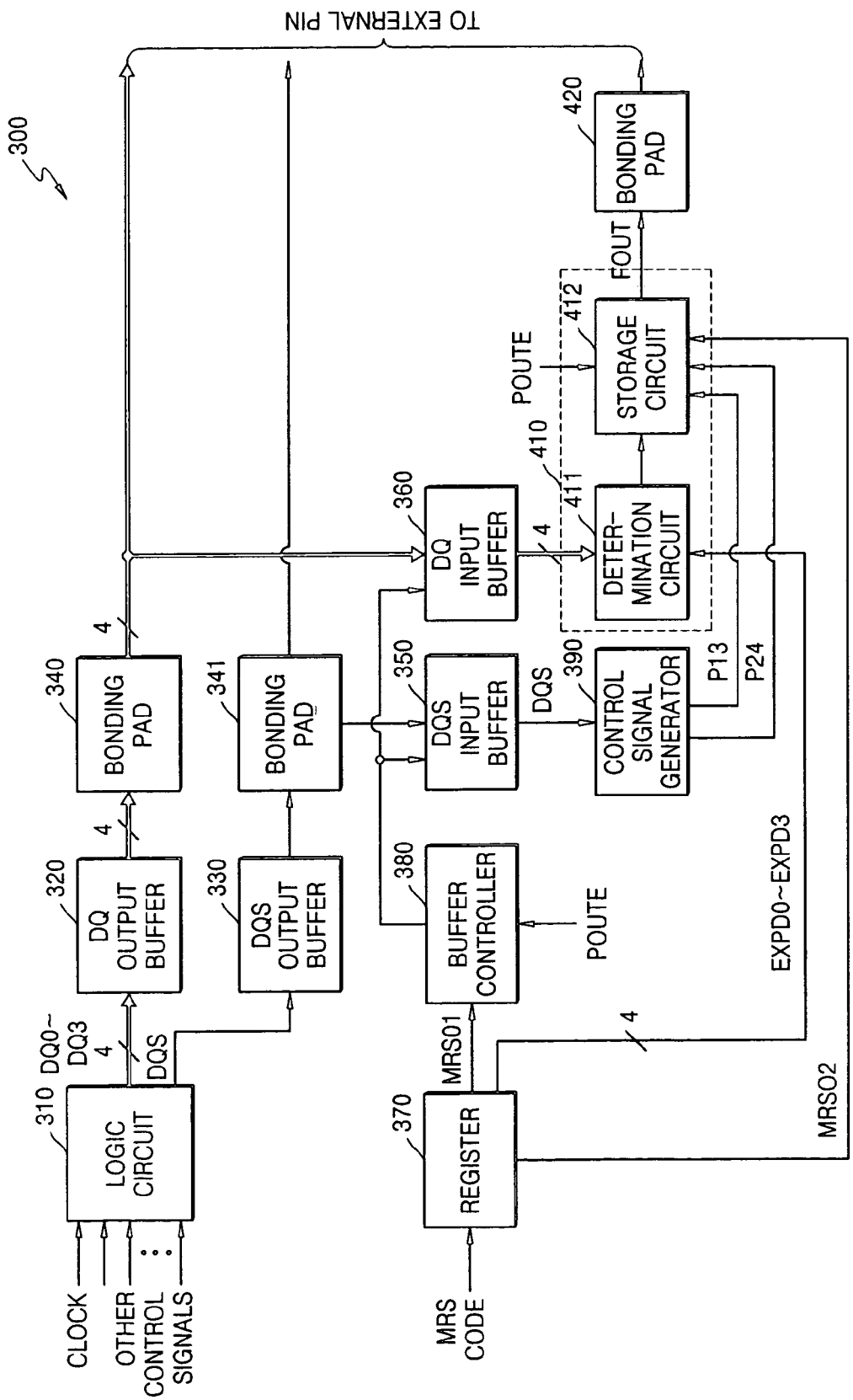
FIG. 3 is a block diagram of an integrated circuit apparatus including a DQ data automatic test circuit according to an embodiment of the present invention.

FIG. 3 is a block diagram of an integrated circuit apparatus 300 including a DQ data automatic test circuit 410 according to an embodiment of the present invention. Referring to FIG. 3, the integrated circuit apparatus 300 includes a logic circuit 310, which performs a core function, a DQ output buffer 320, and a DQS output buffer 330. The DQ output buffer 320 buffers and outputs DQ data DQ0 through DQ3, which are results of a logic operation of the logic circuit 310. The DQS output buffer 330 buffers and outputs a DQ strobe (DQS) signal, which is also a result of the logic operation of the logic circuit 310. The DQ data DQ0 through DQ3 are output to an external pin via a bonding pad 340 and a lead frame (not shown), and the DQS signal is output to the external pin via a bonding pad 341 via the lead frame.

Figure 2A:
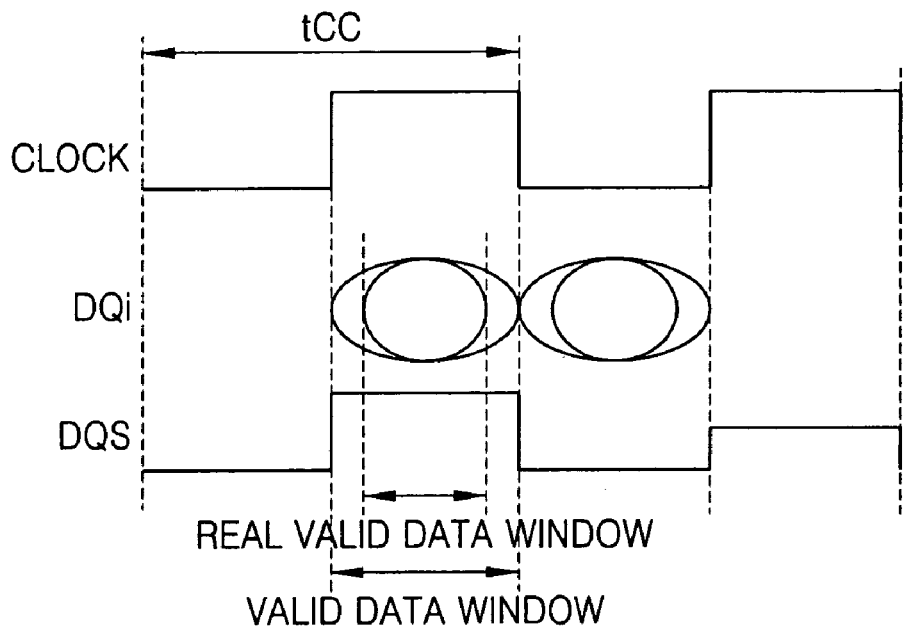
FIG. 2A is a timing diagram illustrating a real valid data window in connection with a test of a single integrated circuit apparatus.
Figure 2B:
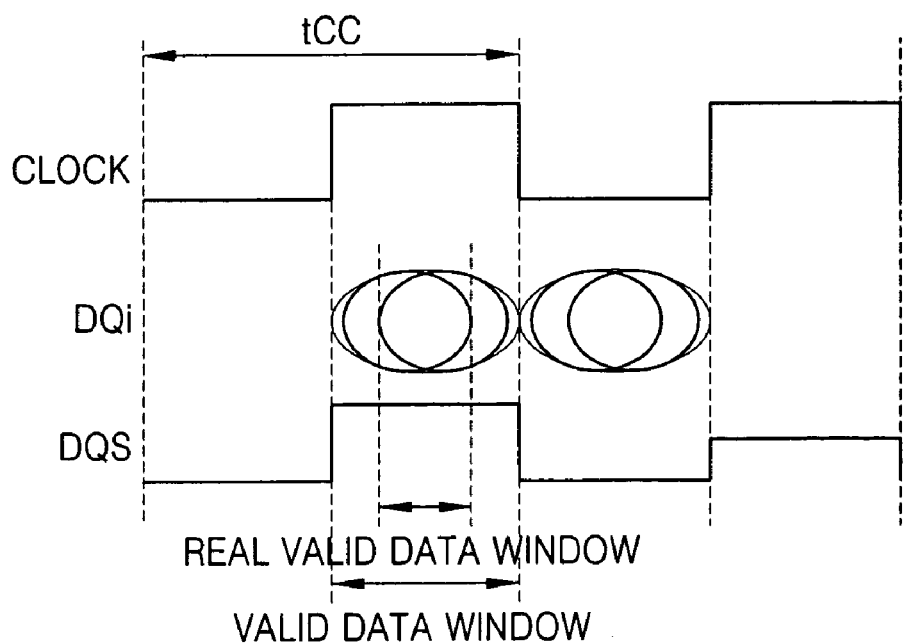
FIG. 2B is a timing diagram illustrating a real valid data window in connection with a test of several integrated circuit apparatuses that are mass-generated.
Figure 6:
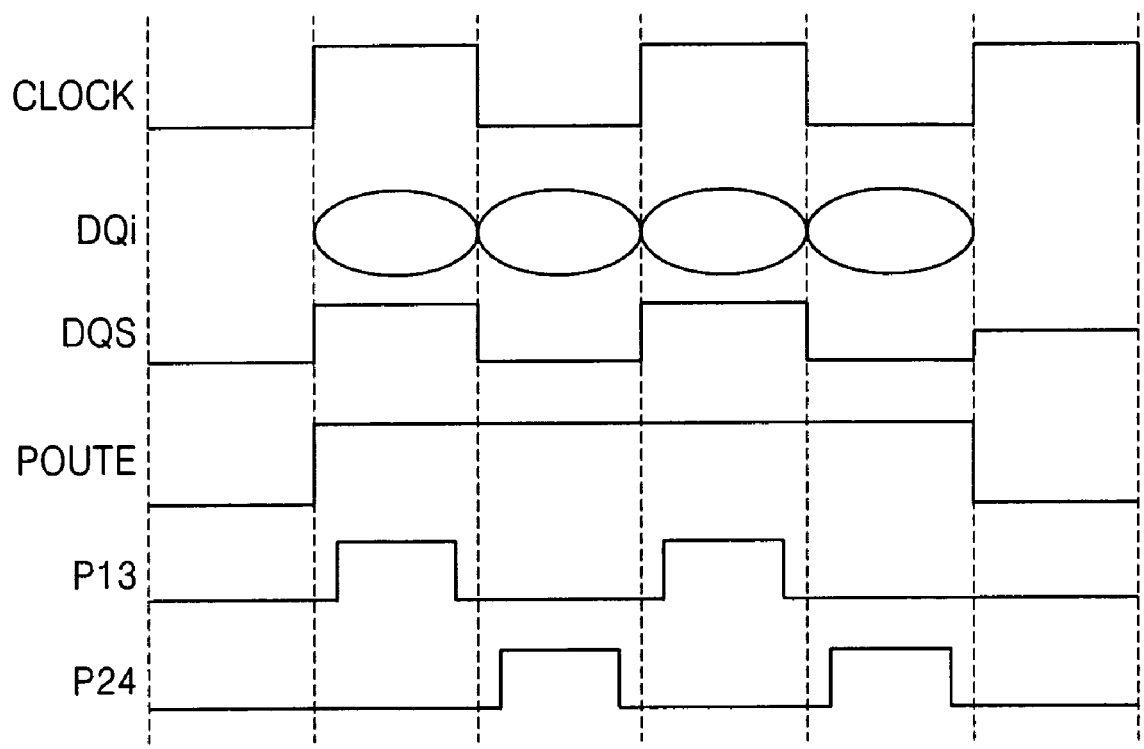
FIG. 6 is a timing diagram illustrating operation of the storage circuit of FIG. 5.

The logic circuit 310 may be a circuit including a memory cell array and its peripheral circuits in an integrated circuit memory, such as a DDR SDRAM, or a logic circuit, e.g., a digital signal processor (DSP), for performing a major function included in another integrated circuit apparatus. The logic circuit 310 performs a logic operation using control signals and outputs results of the logic operation. The results of the logic operation include the DQ data DQ0 through DQ3 and the DQS signal. If an integrated circuit memory device, such as a DDR SDRAM, is tested, the DQ data DQ0 through DQ3 is data read out from an address where a test pattern is stored. If an integrated circuit apparatus other than an integrated circuit memory device is tested, the DQ data DQ0 through DQ3 is data output as a result of a logic operation. Although in the present embodiment, the DQ data DQ0 through DQ3 are of a ×4 DQ type in which four bits of data are output simultaneously, the DQ data may be of various types, such as, a ×8 DQ type, a ×16 DQ type, and the like. Although the logic circuit 310 operates in response to the clock signal CLOCK as shown in FIGS. 2 and 6, the DQ data DQ0 through DQ 3 may not be synchronized with the clock signal CLOCK due to an influence of jitter or the like. In consideration of this situation, the logic circuit 310 generates the DQS signal, whose logic state varies every time the DQ data DQ0 through DQ3 are output. For example, in an integrated circuit memory, such as a DDR SDRAM, the DQ data DQ0 through DQ3 are output at both an edge of a first logic state (logic low) and an edge of a second logic state (logic high) of the DQS signal as shown in FIG. 6.

In FIG. 3, the integrated circuit apparatus 300 further includes a register 370 and an automatic test circuit 410, to perform an automatic test on the logic circuit 310. The integrated circuit apparatus 300 further includes a DQS input buffer 350, a DQ input buffer 360, a buffer controller 380, and a boning pad 420. The bonding pad 420 outputs final pass/fail data FOUT to the external pin. Operation of the automatic test circuit 410 will be described with reference to the flowchart of FIG. 7.

As shown in FIG. 3, input/output pins are generally designed both to output an internal signal to the outside of an integrated circuit apparatus and to receive an external signal at a time different from the point in time when the internal signal is output, to apply the external signal to the inside of the integrated circuit apparatus. For example, the bonding pads 340 and 341, connected to the external pin, can output signals generated by the logic circuit 310 to the outside, and the DQS and DQ input buffers 350 and 360 may receive corresponding signals from the outside via the bonding pads 340 and 341, buffer the received signals, and apply the signals to the inside of the integrated circuit apparatus 300.

Hence, in accordance with the present invention, the automatic test circuit 410 can automatically test the DQ data DQ0 through DQ3 output by the DQ output buffer 320 using the DQS and DQ input buffers 350 and 360, which receive and buffer signals from the bonding pads 341 and 340, respectively, connected to such input/out pins. That is, to perform an automatic test on the DQ data DQ0 through DQ3, the DQS and DQ input buffers 350 and 360 are turned on at an output timing of the DQ data DQ0 through DQ3 so as to be input to the automatic test circuit 410. When each of the DQS and DQ input buffers 350 and 360 is turned on, the DQS signal buffered in the DQS output buffer 330 and the DQ data DQ0 through DQ3 buffered in the DQ output buffer 320 are input to the automatic test circuit 410.

Figure 7:
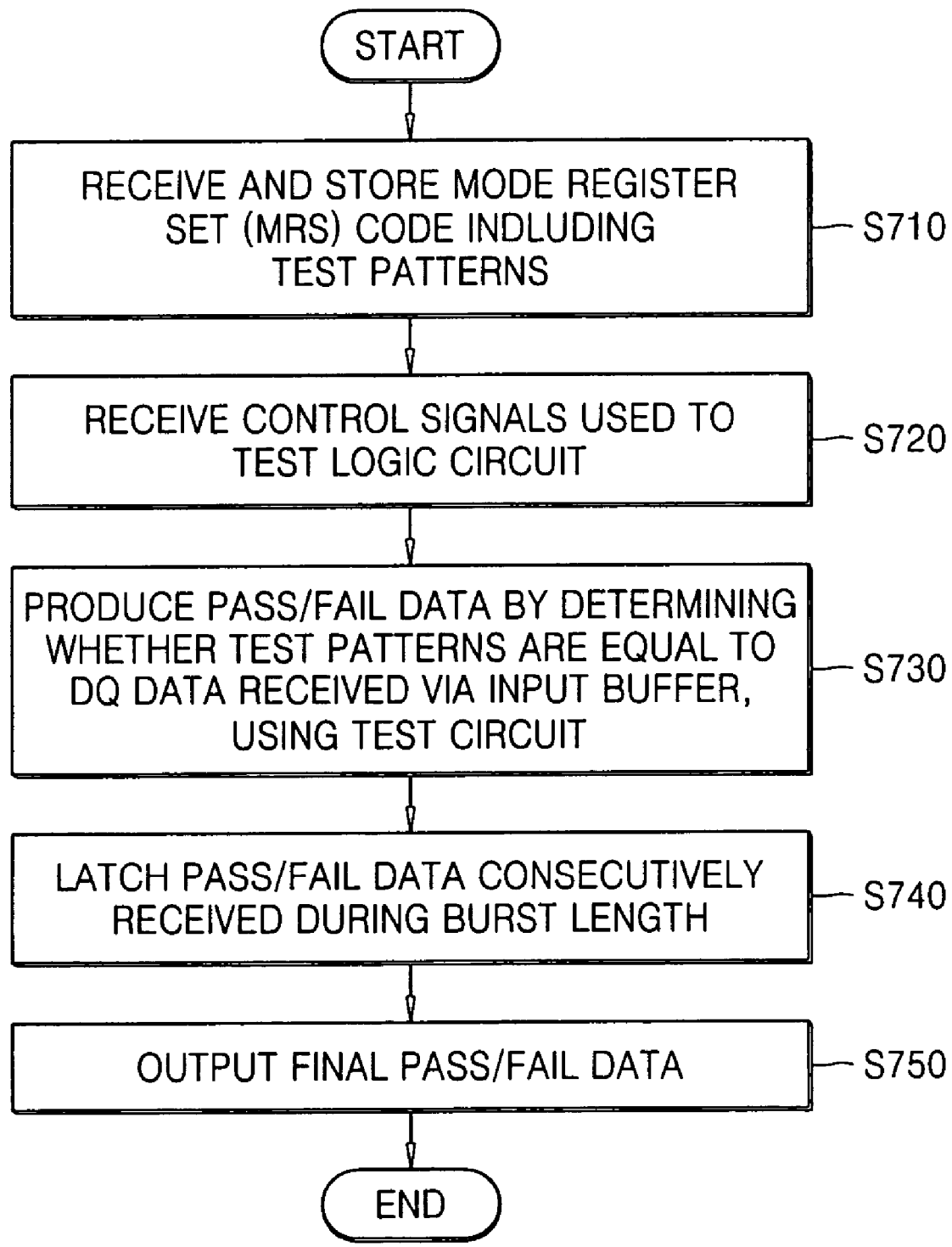
FIG. 7 is a flowchart illustrating an operation of the DQ data automatic test circuit of FIG. 3.

Referring to FIGS. 3 and 7, to test the integrated circuit apparatus 300, first, the register 370 receives and stores a mode register set (MRS) code and outputs first and second set signals MRS01 and MRS02 and test patterns EXPD0 through EXPD3, as illustrated by step S710 of FIG. 7. The test patterns EXPD0 through EXPD3 are expected DQ data DQ0 through DQ3 as results of the logic operation of the logic circuit 310. As is generally known, the MRS code is a digital code used in testing operation of an integrated circuit memory, such as an SDRAM. Such code may be input via predetermined external pins to set the first and second set signals MRS01 and MRS02 and the test patterns EXPD0 through EXPD3. When the register 370 is set up, the clock signal and the control signals used to test operation of the logic circuit 310 are applied to the logic circuit 310, as illustrated in step S720 of FIG. 7. Hence, the logic circuit 310 generates and outputs the DQ data DQ0 through DQ3 and the DQS signal. The DQ output buffer 320 and the DQS output buffer 330 buffer and output corresponding signals.

The DQS and DQ input buffers 350 and 360 can be turned on under the control of the buffer controller 380. When the first set signal MRS01 and a first control signal POUTE are both in a second logic state, the buffer controller 380 turns on the DQS and DQ input buffers 350 and 360. As shown in FIG. 6, the first control signal POUTE maintains the second logic state while the DQ data DQ0 through DQ3 are being output. The first control signal POUTE may be generated by the logic circuit 310.

When the DQS and DQ input buffers 350 and 360 are turned on, the DQS signal received and buffered via the bonding pad 341 and the DQ data DQ0 through DQ3 received and buffered via the bonding pad 340 are input to the automatic test circuit 410. At this time, the test patterns EXPD0 through EXPD3 set in the register 370 are also input to the automatic test circuit 410, as illustrated in step S730 of FIG. 7. Hence, the automatic test circuit 410 determines whether the DQ data DQ0 through DQ3 are the same as the test patterns EXPD0 through EXPD3, and generates the final pass/fail data FOUT.

Figure 4:
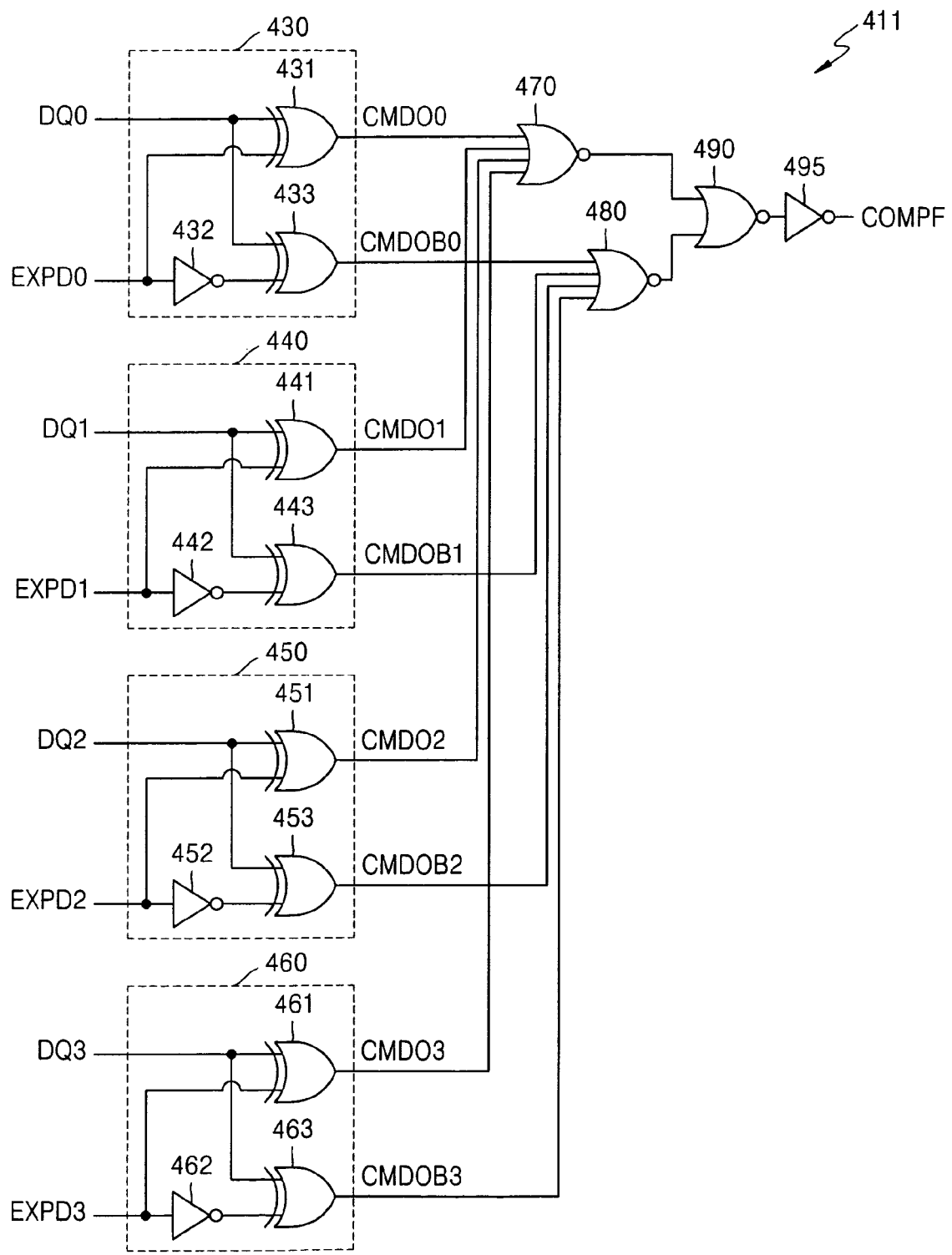
FIG. 4 is a circuit diagram of a determination circuit of FIG. 3.

In FIG. 3, the automatic test circuit 410 includes a determination circuit 411 and a storage circuit 412. A detailed circuit diagram of the determination circuit 411 is shown in FIG. 4. The DQ data DQ0 through DQ3 are of "×4 DQ type" in which 4 bits of data are output. Referring to FIG. 4, the determination circuit 411 compares the first DQ datum DQ0 with the first test pattern EXPD0 using a first Exclusive OR (XOR) logic 431 of a first comparing logic 430. When the first DQ datum DQ0 and the first test pattern EXPD0 are in an identical logic state, the first XOR logic 431 outputs a signal CMDO0 in a first logic state. When the first DQ datum DQ0 and the first test pattern EXPD0 are in different logic states, the first XOR logic 431 outputs a signal CMDO0 in a second logic state. The determination circuit 411 also compares the first DQ datum DQ0 with an inverted signal of the first test pattern EXPD0 output by an inverter 432, using a second XOR logic 433 of the first comparing logic 430. When the first DQ datum DQ0 and the inverted signal of the first test pattern EXPD0 are in an identical logic state, the second XOR logic 433 outputs a signal CMDOB0 in a first logic state. When the first DQ datum DQ0 and the inverted signal of the first test pattern EXPD0 are in different logic states, the second XOR logic 433 outputs a signal CMDOB0 in a second logic state.

The determination circuit 411 compares the second DQ datum DQ1 with the second test pattern EXPD1 using a first XOR logic 441 of a second comparing logic 440. When the second DQ datum DQ1 and the second test pattern EXPD1 are in an identical logic state, the first XOR logic 441 outputs a signal CMDO1 in a first logic state. When the second DQ datum DQ1 and the second test pattern EXPD1 are in different logic states, the first XOR logic 441 outputs a signal CMDO1 in a second logic state. The determination circuit 411 also compares the second DQ datum DQ1 with an inverted signal of the second test pattern EXPD1 output by an inverter 442, using a second XOR logic 443 of the second comparing logic 440. When the second DQ datum DQ1 and the inverted signal of the second test pattern EXPD1 are in an identical logic state, the second XOR logic 443 outputs a signal CMDOB1 in a first logic state. When the second DQ datum DQ1 and the inverted signal of the second test pattern EXPD1 are in different logic states, the second XOR logic 443 outputs a signal CMDOB1 in a second logic state.

The determination circuit 411 compares the third DQ datum DQ2 with the third test pattern EXPD2 using a first XOR logic 451 of a third comparing logic 450. When the third DQ datum DQ2 and the third test pattern EXPD2 are in an identical logic state, the first XOR logic 451 outputs a signal CMDO2 in a first logic state. When the third DQ datum DQ2 and the third test pattern EXPD2 are in different logic states, the first XOR logic 451 outputs a signal CMDO2 in a second logic state. The determination circuit 411 also compares the third DQ datum DQ2 with an inverted signal of the third test pattern EXPD2 output by an inverter 452, using a second XOR logic 453 of the third comparing logic 450. When the third DQ datum DQ2 and the inverted signal of the third test pattern EXPD2 are in an identical logic state, the second XOR logic 453 outputs a signal CMDOB2 in a first logic state. When the third DQ datum DQ2 and the inverted signal of the third test pattern EXPD2 are in different logic states, the second XOR logic 453 outputs a signal CMDOB2 in a second logic state.

The determination circuit 411 compares the fourth DQ datum DQ3 with the fourth test pattern EXPD3 using a first XOR logic 461 of a fourth comparing logic 460. When the fourth DQ datum DQ3 and the fourth test pattern EXPD3 are in an identical logic state, the first XOR logic 461 outputs a signal CMDO3 in a first logic state. When the fourth DQ datum DQ3 and the fourth test pattern EXPD3 are in different logic states, the first XOR logic 461 outputs a signal CMDO3 in a second logic state. The determination circuit 411 also compares the fourth DQ datum DQ3 with an inverted signal of the fourth test pattern EXPD3 output by an inverter 462, using a second XOR logic 463 of the fourth comparing logic 460. When the fourth DQ datum DQ3 and the inverted signal of the fourth test pattern EXPD3 are in an identical logic state, the second XOR logic 463 outputs a signal CMDOB3 in a first logic state. When the fourth DQ datum DQ3 and the inverted signal of the fourth test pattern EXPD3 are in different logic states, the second XOR logic 463 outputs a signal CMDOB3 in a second logic state.

A first Not OR (NOR) logic 470 performs a NOR operation on the signals CMDO0, CMDO1, CMDO2, and CMDO3 and outputs a result of the NOR operation. A second NOR logic 480 performs a NOR operation on the signals CMDOB0, CMDOB1, CMDOB2, and CMDOB3 and outputs a result of the NOR operation. A third NOR logic 490 performs a NOR operation on the outputs of the first and second NOR logics 470 and 480 and outputs a result of the NOR operation. An inverter 495 inverts the output of the third NOR logic 490 and outputs a determination result signal COMPF.

As a result, the determination circuit 411 can generate a determination result signal COMPF in a second logic state when the logic states of the DQ data DQ0 through DQ3 are the same as those of the test patterns EXPD0 through EXPD3, respectively. Even when the logic states of the DQ data DQ0 through DQ3 are opposite to those of the test patterns EXPD0 through EXPD3, respectively, the determination circuit 411 can generate the determination result signal COMPF in the second logic state. In cases other than the two cases, the determination circuit 411 generates a determination result signal COMPF in a first logic state.

Figure 5:
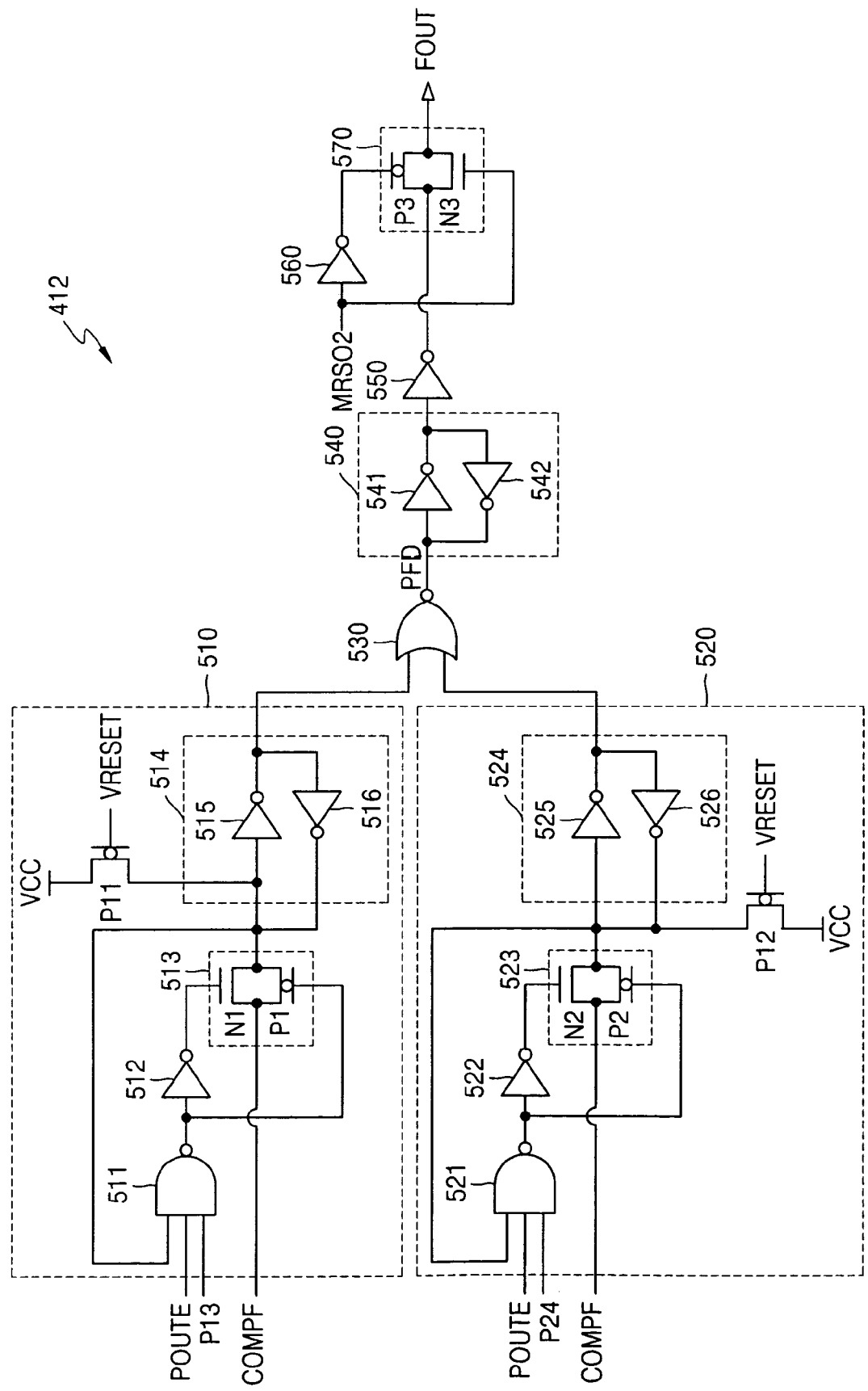
FIG. 5 is a circuit diagram of a storage circuit of FIG. 3.

A detailed circuit diagram of the storage circuit 412 is shown in FIG. 5. A first sampling logic 510 in the storage circuit 412 performs a Not AND (NAND) operation on an input port signal of a latch circuit 514, the first control signal POUTE described above with reference to FIG. 3, and a second control signal P13 using a NAND logic 511 and outputs a result of the NAND operation. The second control signal P13 is generated by a control signal generator 390 of FIG. 3. As shown in FIG. 6, the second control signal P13 has a logic state whose pulse width is smaller than or equal to a pulse width of the DQS signal received via the DQS input buffer 350. An inverter 512 inverts the output of the NAND logic 511 and outputs an inverted signal. In response to the outputs of the NAND logic 511 and the inverter 512, a passgate 513, comprised of an NMOSFET N1 and a PMOSFET P1, samples a logic state of the determination result signal COMPF when the DQS signal (or the second control signal P13) is in a second logic state, and outputs sampled signals. The sampled signals are accumulated and latched by the latch circuit 514, which is comprised of two inverters 515 and 516. An input and an output of the inverter 515 are connected to an output and an input of the inverter 516, respectively. If any one of the consecutive sampled signals has a first logic state, the latch circuit 514 maintains and outputs a second logic state. Otherwise, the latch circuit 514 maintains and outputs a logic state (i.e., a first logic state) opposite to the second logic state. When the sampled signal in the first logic state is output by the latch circuit 514, the DQ data DQ0 through DQ3 are not consistent with the test patterns EXPD0 through EXPD3, so the logic circuit 310 is failed. In this case, the passgate 513 is turned off during a corresponding burst length, so the latch circuit 514 maintains and outputs a first logic state indicating a failure until an input port of the latch circuit 514 is reset to a power supply voltage VCC by a PMOSFET P11, which receives a reset signal VRESET. The reset signal VRESET is activated between a current burst length and a next burst length.

Likewise, a second sampling logic 520 in the storage circuit 412 performs a NAND operation on an input port signal of a latch circuit 524, the first control signal POUTE, and a third control signal P24 using a NAND circuit 521 and outputs a result of the NAND operation. The third control signal P24 is generated by the control signal generator 390 of FIG. 3. As shown in FIG. 6, the third control signal P24 has a logic state opposite to the logic state of the DQS signal and a pulse narrower than a pulse of the DQS signal. An inverter 522 inverts the output of the NAND logic 521 and outputs an inverted signal. In response to the outputs of the NAND logic 521 and the inverter 522, a passgate 523, comprised of an NMOSFET N2 and a PMOSFET P2, samples a logic state of the determination result signal COMPF at a first logic state of the DQS signal (or at a second logic state of the third control signal P24) and outputs sampled signals. The sampled signals are accumulated and latched by the latch circuit 524, which is comprised of two inverters 525 and 526. An input and an output of the inverter 525 are connected to an output and an input of the inverter 526, respectively. If any one of the consecutive sampled signals has a first logic state, the latch circuit 514 maintains and outputs a second logic state. Otherwise, the latch circuit 524 maintains and outputs a logic state (i.e., a first logic state) opposite to the second logic state. When the sampled signal in the first logic state is output by the latch circuit 524, the passgate 523 is turned off during a present burst length, so the latch circuit 524 maintains and outputs a first logic state indicating a failure until an input port of the latch circuit 524 is reset to the power supply voltage VCC by a PMOSFET P12, which receives the reset signal VRESET.

Accordingly, in FIG. 5, a NOR logic 530 performs a NOR operation on outputs of the first and second sampling logics 510 and 520 that are consecutively received during a burst length, and outputs a result of the NOR operation as pass/fail data PFD. As shown in FIG. 6, the burst length is set to be 4. However, the present invention is not limited to the burst length of 4.

A latch circuit 540 inverts pass/fail data PFD consecutively received during a burst length using an inverter 541 and an inverter 542 and outputs an inverted signal of the pass/fail data PFD, as illustrated in step S740 of FIG. 7. An input and an output of the inverter 541 are connected to an output and an input of the inverter 542, respectively. A first inverter 550 inverts the output of the latch circuit 540 and outputs an inverted signal. A second inverter 560 inverts the second set signal MRS02 output by the register 370 of FIG. 3 and outputs a result of the inversion. A passgate 570, comprised of an NMOSFET N3 and a PMOSFET P3, outputs the output of the first inverter 550 as the final pass/fail data FOUT in response to the second set signal MRS02 and the output of the second inverter 560, as illustrated in step 750 of FIG. 7.

Figure 1:
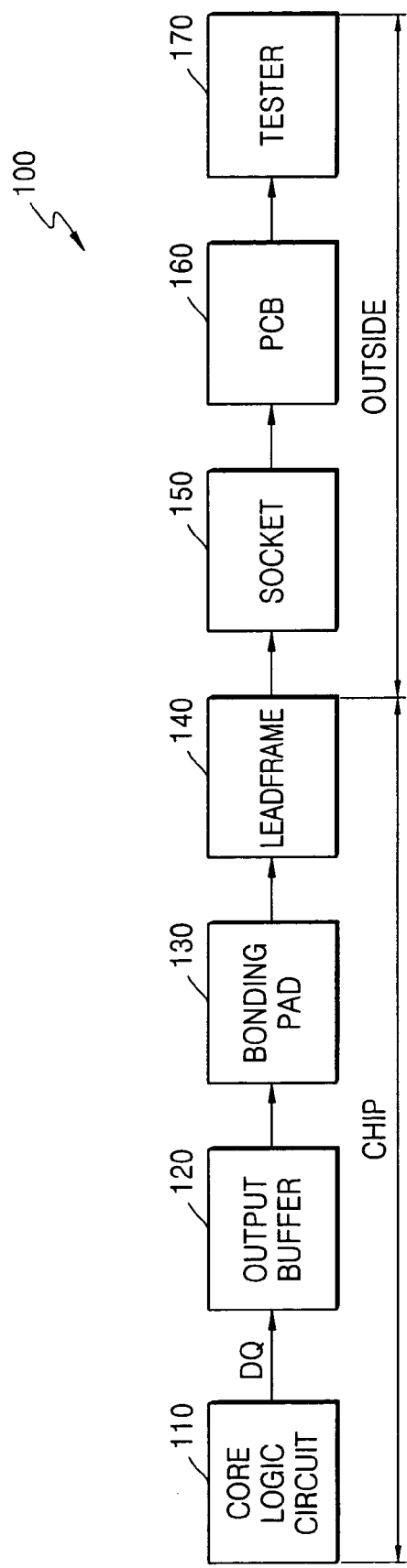
FIG. 1 is a schematic block diagram illustrating testing of a conventional integrated circuit apparatus.
Figure 8:
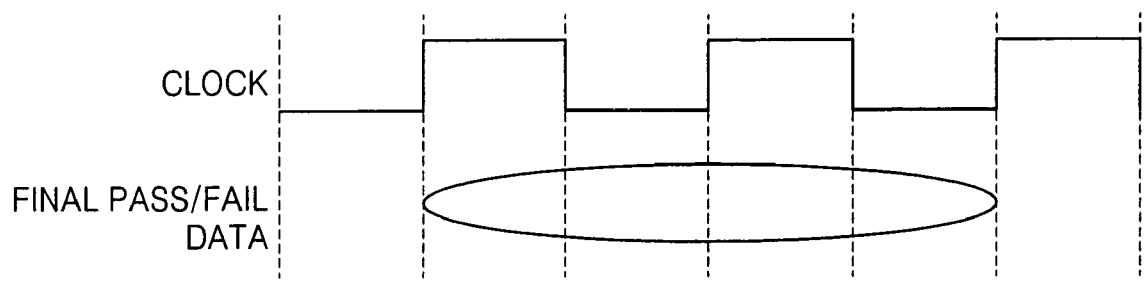
FIG. 8 is a timing diagram illustrating output of final pass/fail data.

In summary, the storage circuit 412 generates final pass/fail data FOUT having a first logic state when any one of signals obtained by sampling the determination result signal COMPF at a first logic state of the DQS signal has a first logic state or when any one of the signals obtained by sampling the determination result signal COMPF at a second logic state of the DQS signal has the first logic state. The storage circuit 412 checks logic states of consecutive determination result signals COMPF. If all of the consecutive determination result signals COMPF have a second logic state, the storage circuit 412 generates final pass/fail data FOUT having a second logic state. The storage circuit 412 checks the logic states of the consecutive determination result signals COMPF when the DQS signal is in a first logic state and those when the DQS signal is in a second logic state. In response to the second set signal MRS02, the storage circuit 412 outputs the final pass/fail data FOUT. As shown in FIG. 8, the final pass/fail data FOUT is preferably output via a predetermined DQ pin over at least one cycle of the clock signal CLOCK. The final pass/fail data FOUT are collected in a predetermined tester (refer to FIG. 1) and used in determining pass or failure of a product.

As described above, in the integrated circuit apparatus 300, the register 370 stores the test patterns EXPD0 through EXPD3 using the MRS code, and accordingly, the DQ data automatic test circuit 410 compares the test patterns EXPD0 through EXPD3 with the DQ data DQ0 through DQ3 received from the core logic circuit 310 via the bonding pad 340, to thereby determine pass or failure of the integrated circuit apparatus 300. If all of the test patterns EXPD0 through EXPD3 have the same logic states as those of the received DQ data DQ0 through DQ3 or if the test patterns EXPD0 through EXPD3 are all in logic states opposite to the logic states of the received DQ data DQ0 through DQ3, the DQ data automatic test circuit 410 determines that the integrated circuit apparatus 300 has passed. Otherwise, the DQ data automatic test circuit 410 determines that the integrated circuit apparatus 300 has failed. When a failure determination is made even once during a burst length, the first logic state of pass/fail data PFD is not changed, and the pass/fail data PFD in the first logic state is output as the final pass/fail data FOUT after completion of the test made by the DQ data automatic test circuit 410. When no failure determinations are made even once during the burst length, the final pass/fail data FOUT in the second logic state is output.

Figure 9:
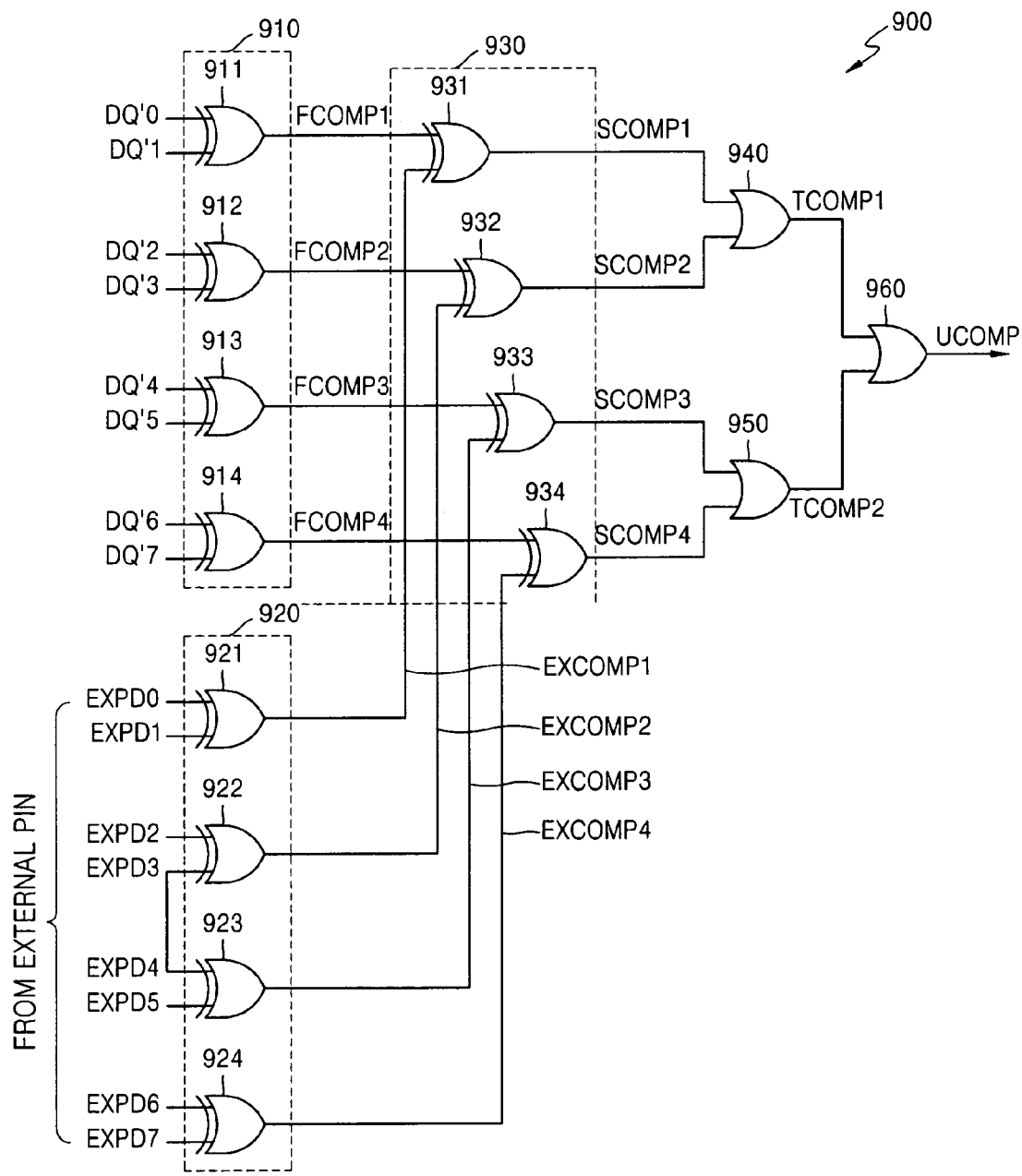
FIG. 9 is a block diagram of a DQ data automatic test circuit according to another embodiment of the present invention.

FIG. 9 is a block diagram of a DQ data automatic test circuit 900 according to another embodiment of the present invention. In contrast with the DQ data automatic test circuit 410 of FIG. 3 using the MRS code, the DQ data automatic test circuit 900 receives test patterns EXPD0 through EXPD7, which are expected results of a logic operation by an internal logic circuit (e.g., the core logic circuit 310 of FIG. 3), directly from an external pin and compares the test patterns EXPD0 through EXPD7 with output data DQ'0 through DQ'7, which are actual results of the logic operation of the core logic circuit 310. Referring to FIG. 9, the DQ data automatic test circuit 900 includes an internal data comparison logic 910, an external data comparison logic 920, a result comparison logic 930, and OR logics 940 through 960. Operation of the DQ data automatic test circuit 900 will be described with reference to Tables 1 and 2. Table 1 indicates logic states of signals shown in FIG. 9 in a normal case. Table 2 indicates logic states of the signals shown in FIG. 9 when DQ'2 to be in the second logic state "1" in a normal case is output in the first logic state "0" due to an error.

TABLE 1

| Input | | FCOMPi | EXCOMPi | SCOMPi | TCOMPi | UCOMPi |
|---|---|---|---|---|---|---|
| DQ'0: 1 | EXPD0: 1 | FCOMP1: 1 | EXCOMP1: 1 | SCOMP1: 0 | TCOMP1: 0 | UCOMP1: 0 |
| DQ'1: 0 | EXPD1: 0 | | | | | |
| DQ'2: 1 | EXPD2: 1 | FCOMP2: 1 | EXCOMP2: 1 | SCOMP1: 0 | | |
| DQ'3: 0 | EXPD3: 0 | | | | | |
| DQ'4: 1 | EXPD4: 1 | FCOMP3: 1 | EXCOMP3: 1 | SCOMP1: 0 | TCOMP2: 0 | |
| DQ'5: 0 | EXPD5: 0 | | | | | |
| DQ'6: 1 | EXPD6: 1 | FCOMP4: 1 | EXCOMP4: 1 | SCOMP1: 0 | | |
| DQ'7: 0 | EXPD7: 0 | | | | | |

TABLE 2

| Input | | FCOMPi | EXCOMPi | SCOMPi | TCOMPi | UCOMPi |
|---|---|---|---|---|---|---|
| DQ'0: 1 | EXPD0: 1 | FCOMP1: 1 | EXCOMP1: 1 | SCOMP1: 0 | TCOMP1: 1 | UCOMP1: 1 |
| DQ'1: 0 | EXPD1: 0 | | | | | |
| DQ'2: 0 | EXPD2: 1 | FCOMP2: 0 | EXCOMP2: 1 | SCOMP1: 1 | | |
| DQ'3: 0 | EXPD3: 0 | | | | | |
| DQ'4: 1 | EXPD4: 1 | FCOMP3: 1 | EXCOMP3: 1 | SCOMP1: 0 | TCOMP2: 0 | |
| DQ'5: 0 | EXPD5: 0 | | | | | |
| DQ'6: 1 | EXPD6: 1 | FCOMP4: 1 | EXCOMP4: 1 | SCOMP1: 0 | | |
| DQ'7: 0 | EXPD7: 0 | | | | | |

The internal data comparison logic 910 includes a plurality of XOR logics 911 through 914. Each of the XOR logics 911 through 914 compares logic states of two of the output data DQ'0 through DQ'7 and outputs a comparison result FCOMPi. For example, when the logic states of the two of the output data DQ'0 through DQ'7 are identical, the XOR logics 911 through 914 output signals FCOMP1 through FCOMP4 in a first logic state, respectively. On the other hand, when the logic states of the two of the output data DQ'0 through DQ'7 are different, the XOR logics 911 through 914 output signals FCOMP1 through FCOMP4 in a second logic state, respectively. The output data DQ'0 through DQ'7, which are actual results of the logic operation of the core logic circuit 310 of FIG. 3, may be data output by a memory cell array of a memory device and transmitted to an input output (IO) line, that is, data that has not yet reached the bonding pad 340 or the DQ output buffer 320.

The external data comparison logic 920 includes a plurality of XOR logics 921 through 924. The XOR logics 921 through 924 receive the text patterns EXPD0 through EXPD7 from the external pin of FIG. 3, each compare logic states of two of the text patterns EXPD0 through EXPD7, and output comparison results EXCOMP1 through EXCOMP4, respectively. For example, when the logic states of the two of the output data EXPD0 through EXPD7 are identical, the XOR logics 921 through 924 output signals EXCOMP1 through EXCOMP4 in a first logic state, respectively. On the other hand, when the logic states of the two of the output data DQ'0 through DQ'7 are different, the XOR logics 921 through 924 output signals EXCOMP1 through EXCOMP4 in a second logic state, respectively. The text patterns EXPD0 through EXPD7, which are expected results of the internal logic operation, are directly input to the DQ data automatic test circuit 900 via the external pin of the integrated circuit apparatus 300 and have the same logic states as the logic states of the output data DQ'0 through DQ'7, respectively. The number of text patterns EXPD0 through EXPD7 received is set to be equal to the number of output data DQ'0 through DQ'7 received.

The result comparison logic 930 includes a plurality of XOR logics 931 through 934. The XOR logics 931 through 934 compare the logic states of the signals FCOMP1 through FCOMP4, respectively, with the logic states of the signals EXCOMP1 through EXCOMP4, respectively. If the signals FCOMP1 through FCOMP4 have the same logic states as those of the signals EXCOMP1 through EXCOMP4, respectively, the XOR logics 931 through 934 output signals SCOMP1 through SCOMP4 in a first logic state, respectively. Otherwise, the XOR logics 931 through 934 output signals SCOMP1 through SCOMP4 in a second logic state, respectively.

The OR logics 940 and 950 receive the signals SCOMP1 through SCOMP4 from the result comparison logic 930 and perform an OR operation on the signals SCOMP1 and SCOMP2 and an OR operation on the signals SCOMP3 and SCOMP4, respectively. The OR logic 960 performs a subsequent OR operation on outputs TCOMP1 and TCOMP2 of the OR logics 940 and 950 to obtain a single signal UCOMP. If an OR operation on the result SCOMPi of the logic operation of the result comparison logic 930 results in two or more signals, the OR logics 940 through 960 re-performs the OR operation on each two resultant signals. If the re-OR-operation still results in two or more signals, the OR operation is re-performed on each two resultant signals until the final result UCOMP is obtained.

As indicated in Table 1, when the output data DQ'0 through DQ'7 is 10101010 and the text patterns EXPD0 through EXPD7 are 10101010, the final result UCOMP of the OR logics 940 through 960 is in a first logic state in a normal situation. In this case, the output data DQ'0 through DQ'7 are all normal due to a normal operation of the core logic circuit 310, so a pass determination is made. However, when the output datum DQ'2 to be in a second logic state "1" in a normal situation as in Table 1 is actually in a first logic stage "0" due to some error, the final result UCOMP of the OR logics 940 through 960 is in a second logic state as in Table 2. In this case, the output data DQ'2 among the output data DQ'0 through DQ'7 is abnormal due to an abnormal operation of the core logic circuit 310, so a fail determination is made. Even when one of the output data DQ'0 through DQ'7 is abnormal as indicated in Table 2, a general PBT circuit makes a pass determination because it includes only logics corresponding to the internal data comparison logic 910 and the OR logics 940 through 960 of FIG. 9 except for logics corresponding to the external data comparison logic 920, which receives the text patterns EXPD0 through EXPD7 from an external source and compares the output data DQ'0 through DQ'7 with them, and the result comparison logic 930 of FIG. 9. Thus, the DQ data automatic test circuit 900 can increase the accuracy of a pass/fail determination compared to the general PBT circuit.

Although a memory device corresponding to FIG. 9 is of a ×8 DQ type in which 8 bits, that is, the output data DQ'0 through DQ'7 or the text patterns EXPD0 through EXPD7, are output simultaneously, the memory device may be of various types, such as, a ×16 DQ type, a ×32 DQ type, or the like.

As described above, an integrated circuit apparatus according to the present invention includes an enhanced test circuit so as to be internally and automatically tested. Thus, a reduction of a valid data window can be completely solved. Also, a minimum number of DQ pins for outputting final pass/fail data are required as the number of DQ pins for outputting data. Furthermore, since test patterns are set by an MRS code or received from an external source via an external pin, they are not limited to predetermined test patterns required by a general PBT circuit. Thus, various types of test patterns may be used to perform a test.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An integrated circuit apparatus comprising:
   a logic circuit generating DQ data and a DQS signal synchronized with the DQ data;
   a register receiving and storing a mode register set (MRS) code and outputting test patterns, which are generated using the MRS code and are expected outputs of the logic circuit, a first set signal, and a second set signal; and
   an automatic test circuit receiving the DQS signal and the DQ data via respective bonding pads, determining whether the received DQ data are the same as the test patterns, and outputting final pass/fail data in accordance with the first and second set signals.

2. The integrated circuit apparatus of claim 1, in which the automatic test circuit comprises:
   a determination circuit comparing the DQ data with the test patterns to generate a determination result signal; and
   a storage circuit checking logic states of consecutive determination result signals and storing and outputting final pass/fail data in a first condition when any one of the consecutive determination result signals has a first logic state and storing and outputting final pass/fail data in a second condition when all of the consecutive determination result signals have the second logic state.

3. The integrated circuit apparatus of claim 2, in which the determination circuit receives the DQS signal and the DQ data in response to the first set signal.

4. The integrated circuit apparatus of claim 2, in which the determination circuit generates the determination result signal in the second logic state when all of the DQ data have the same logic states as logic states of the test patterns or when all of the logic states of the DQ data have logic states opposite to the logic states of the test patterns, and otherwise, generates the determination result signal in the first logic state.

5. The integrated circuit apparatus of claim 2, in which the storage circuit outputs the final pass/fail data in response to the second set signal.

6. The integrated circuit apparatus of claim 2, in which the storage circuit checks the logic state of the determination result signal at both first and second logic states of the DQS signal.

7. The integrated circuit apparatus of claim 6, in which the storage circuit generates the final pass/fail data in the first condition when any one of the signals obtained by sampling the determination result signal at a first logic state of the DQS signal, has a first logic state or when any one of the signals obtained by sampling the determination result signals at a second logic state of the DQS signal, has a first logic state.

8. The integrated circuit apparatus of claim 7, in which the storage circuit comprises:
  a first sampling logic sampling a logic state of the determination result signal when the DQS signal is in the second logic state and latching sampled signals using a latch circuit, wherein when any one of the sampled signals has the first logic state, the latch circuit latches a logic state, and otherwise, the latch circuit latches a logic state opposite to the logic state;
  a second sampling logic sampling a logic state of the determination result signal when the DQS signal is in the first logic state and latching sampled signals using a latch circuit, wherein when any one of the sampled signals has the first logic state, the latch circuit latches a logic state, and otherwise, the latch circuit latches a logic state opposite to the logic state;
  a NOR logic performing a NOR operation on the outputs of the first and second sampling logics and outputting a result of the NOR operation as pass/fail data;
  a latch circuit including two inverters connected to each other in such a way that an input and an output of one inverter are connected to an output and an input of the other inverter, respectively, the latch circuit receiving the pass/fail data via one of the two inverters, latching the pass/fail data, and outputting an inverted signal of the pass/fail data;
  a first inverter inverting an output of the latch circuit;
  a second inverter inverting the second set signal; and
  a passgate outputting an output of the first inverter as the final pass/fail data in response to the second set signal and the output of the second inverter.

9. A method of testing an integrated circuit apparatus, the method comprising:
  generating DQ data and a DQS signal synchronized with the DQ data using a logic circuit which performs a logic operation;
  receiving and storing a mode register set (MRS) code and outputting test patterns, which are generated using the MRS code and are expected outputs of the logic circuit, and first and second set signals; and
  receiving the DQS signal and the DQ data via respective bonding pads, determining whether the received DQ data are the same as the test patterns, and outputting final pass/fail data in accordance with the first and second set signals.

10. The method of claim 9, in which the generating of the final pass/fail data comprises:
  comparing the DQ data with the test patterns to generate a determination result signal; and
  checking logic states of consecutive determination result signals and storing and outputting final pass/fail data having a first logic state when any one of the consecutive determination result signals has a first logic state and storing and outputting final pass/fail data having a second logic state when all of the consecutive determination result signals have the second logic state.

11. The method of claim 10, in which the DQS signal and the DQ data are received in response to the first set signal and used to generate the final pass/fail data.

12. The method of claim 10, in which the determination result signal in the second logic state is generated when all of the DQ data have the same logic states as logic states of the test patterns or when all of the logic states of the DQ data have logic states opposite to the logic states of the test patterns, and otherwise, the determination result signal in the first logic state is generated.

13. The method of claim 10, in which the final pass/fail data is output to a DQ pad in response to the second set signal.

14. The method of claim 10, in which the logic state of the determination result signal is checked at both first and second logic states of the DQS signal.

15. The method of claim 14, in which the final pass/fail data in the first condition is generated when any one of the signals obtained by sampling the determination result signal at a first logic state of the DQS signal has a first logic state or when any one of the signals obtained by sampling the determination result signals at a second logic state of the DQS signal has a first logic state.

16. The method of claim 15, in which the storing and outputting of the final pass/fail data comprises:
  sampling a logic state of the determination result signal when the DQS signal is in the second logic state and latching sampled signals using a latch circuit, wherein when any one of the sampled signals has the first logic state, the latch circuit latches a logic state, and otherwise, the latch circuit latches a logic state opposite to the logic state;
  sampling a logic state of the determination result signal when the DQS signal is in the first logic state and latching sampled signals using a latch circuit, wherein when any one of the sampled signals has the first logic state, the latch circuit latches a logic state, and otherwise, the latch circuit latches a logic state opposite to the logic state;
  performing a NOR operation on the outputs of the first and second sampling logics and outputting a result of the NOR operation as pass/fail data;
  receiving the pass/fail data via one of two inverters connected to each other in such a way that an input and an output of one inverter are connected to an output and an input of the other inverter, respectively, latching the pass/fail data, and outputting an inverted signal of the pass/fail data;
  inverting the output of the latch circuit;
  inverting the second set signal; and
  outputting the inverted output of the latch circuit as the final pass/fail data in response to the second set signal and the inverted second set signal.

* * * * *

UNITED STATES PATENT AND TRADEMARK OFFICE
CERTIFICATE OF CORRECTION

PATENT NO.         : 7,634,702 B2                                    Page 1 of 1
APPLICATION NO.    : 11/182532
DATED              : December 15, 2009
INVENTOR(S)        : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 910 days.

Signed and Sealed this

Ninth Day of November, 2010

David J. Kappos
*Director of the United States Patent and Trademark Office*